United States Patent [19]

Nakao et al.

[11] Patent Number: 5,323,484
[45] Date of Patent: Jun. 21, 1994

[54] HEATING APPARATUS WITH MULTILAYER INSULATING STRUCTURE

[75] Inventors: Ken Nakao, Sagamihara; Seiji Sakurai, Yokohama; Yoshihisa Miyahara, Yokohama; Yoshiyuki Motoyoshi, Yokohama, all of Japan

[73] Assignee: Tokyo Electron Sagami Kabushiki Kaisha, Shiroyama, Japan

[21] Appl. No.: 12,151

[22] Filed: Jan. 28, 1993

[30] Foreign Application Priority Data

Feb. 3, 1992 [JP] Japan ................................. 4-046349

[51] Int. Cl.⁵ ........................... H05B 3/64; F27D 1/00
[52] U.S. Cl. .................................... 392/416; 219/390; 373/137; 110/336
[58] Field of Search ................. 392/416, 418; 219/390, 219/405, 411; 373/137, 109; 110/336; 165/135-136

[56] References Cited

U.S. PATENT DOCUMENTS

| | | | |
|---|---|---|---|
| 3,735,008 | 5/1973 | Ieda et al. | 373/137 |
| 4,147,888 | 4/1979 | Sato | 373/137 |
| 4,493,089 | 1/1985 | Abell | 373/137 |
| 4,966,201 | 10/1990 | Svec et al. | 138/141 |
| 5,038,019 | 8/1991 | McEntire et al. | 219/390 |
| 5,229,576 | 7/1993 | Nakao et al. | 219/390 |

FOREIGN PATENT DOCUMENTS

529194  7/1931  Fed. Rep. of Germany ...... 373/109

Primary Examiner—Bruce A. Reynolds
Assistant Examiner—John A. Jeffery
Attorney, Agent, or Firm—Beveridge, DeGrandi, Weilacher & Young

[57] ABSTRACT

A heating apparatus including a process tube in which the target objects are arranged in an internal heating area and a multilayer insulating structure arranged so to enclose the process tube. At the inner face of an inorganic molded structure of bulk density 0.3-0.8 g/cm³, an inorganic insulating layer of bulk density 1.0-2.0 g/cm³ covered on the inner face or all faces thereof by inorganic cloth is provided to form the multilayer insulating structure. The inner face of the inorganic insulating layer is used to support a heat generating means. A cooling means is also provided for cooling the flat heating area of the process tube. As a result, a heating apparatus of the present invention is provided that features excellent endurance against spalling, deterioration and chemical reaction, and which is capable of long term stability with respect to temperature increase and decrease.

13 Claims, 4 Drawing Sheets

HEATING APPARATUS WITH MULTILAYER INSULATING STRUCTURE

BACKGROUND OF THE INVENTION

This invention pertains to a heating apparatus. Heat treatment of such target objects as semiconductor wafers is involved among the numerous processes in semiconductor device manufacturing. Examples of such treatment are oxidation treatment, scattering treatment, CVD treatment, epitaxial treatment, doping treatment and others.

The heating apparatus employed for such heat treatment typically consists of a processing vessel such as a reaction tube, in which the semiconductor wafer target objects are placed, heat insulating material enclosing this processing vessel, and a heat generating means located at the inner wall of this heat insulating material.

Conventionally, ceramic fiber is utilized as this heat insulating material, while the heat generating means typically consists of Kanthal (tradename) wire, an alloy of iron (Fe), chromium (Cr) and aluminum (Al) or similar resistance type heat generating material.

Recently, a heating apparatus capable of high speed temperature increase and decrease has been sought for the purpose of improving semiconductor device manufacturing efficiency. However, since a heat generating means composed of Kanthal wire has a low permissible current density, achieving a sufficiently fast temperature rise is difficult.

Studies were undertaken by the inventors involving the use of molybdenum disilicide ($MoSi_2$) as a material for the heat generating means. If $MoSi_2$ is used, the heat capacity is small and high speed temperature rise is possible.

$MoSi_2$ is difficult to oxidize in comparison to Kanthal and other conventionally used heat generating means. The power making amount (watts or amperes per square cm) is about 10 times, enabling large heat application. But conversely, sudden heating subjects the insulating material to large heat shock and, for example, when using a double insulator in which the outer density is small and the inner density is large, cracks are easily produced.

Consequently, when using a heat generating means made of $MoSi_2$ for repeated processes that involve high speed temperature rise, cracks are easily produced in a ceramic fiber insulator due to spalling and powdering occurs due to thermal deterioration of the materials composing the insulator.

Another problem occurs in the cooling process required after semiconductor wafer heat treatment. Cooling medium is employed in order to quickly reduce the temperature in the processing vessel heated area. But when this is repeated, the insulator material deteriorates, peeling occurs and particles are produced which form a cause of contamination.

Chemical reaction occurs at the points of contact between a heat generating means formed from $MoSi_2$ and an insulator made of ceramic fiber, the problem of open wiring is encountered.

SUMMARY OF THE INVENTION

The first objective of this invention is to provide a heating apparatus with excellent durability with respect to spalling, deterioration and chemical reactivity. The second objective is to provide a heating apparatus capable of long term stability against temperature increase and decrease.

For achieving the above objectives, the heating apparatus of this invention possesses the following features.

(1) At the inner face of an inorganic molded structure of bulk density 0.3–0.8 $g/cm^3$, an inorganic insulating layer of bulk density 1.0–2.0 $g/cm^3$ covered on the inner face or all faces thereof by inorganic cloth is provided to form the multilayer insulating structure, thus composing a multilayered insulating structure. This inorganic insulating layer is used for supporting the heat generating means.

(2) The multilayered insulating structure is baked at high temperature.

(3) The inorganic molded structure is composed of a plurality of segments, which are brought together and joined to form a cylindrical shape.

(4) The inorganic molded structure is molded from alumina fiber, inorganic filler material and inorganic binder.

(5) The alumina fiber contains more than 90 weight percent of $Al_2O_3$.

(6) The percentages of metallic elements contained as impurities in the multilayered insulating structure are limited to the following ranges.

| Total sodium (Na) and potassium (K) | less than 2000 ppm |
| Copper (Cu) | less than 50 ppm |
| Iron (Fe) | less than 500 ppm |
| Nickel (Ni) | less than 50 ppm |

(7) The heating apparatus is provided with a processing vessel in the internal heating area for containing the treatment targets, a multilayer insulating structure enclosing the processing vessel, a heat generating means supported by the inorganic insulating layer of the multilayer structure, and a cooling means for cooling the flat heating area of the processing vessel.

(8) The heat generating means is formed from molybdenum disilicide ($MoSi_2$).

The heating apparatus of this invention utilizes a multilayer structure comprising a small bulk density inorganic molded structure overlapped by a plurality of large bulk density inorganic insulating layers. The inner face or all faces of the inorganic insulating layers are reinforced by inorganic fiber cloth, which serves to avoid risk of cracking or peeling due to heat shock even at times of high speed temperature increase and decrease.

Since the multilayer structure is baked at high temperature, deformation is minimal.

The inorganic molded structure comprises a plurality of segments which are brought together and joined into a cylindrical shape, thus allowing precise construction.

Since the inorganic molded structure is molded from alumina fiber, inorganic filler and inorganic binder, loose particle formation is minimal.

The alumina fiber contains more than 90 weight percent of $Al_2O_3$, thus improving heat durability. Contamination is also minimal since the specified metallic element impurities included in the multilayer structure are suppressed to below specific amounts.

A cooling means is provided for the processing vessel heating area. Even with rapid temperature increase and decrease, the multilayer structure does not deteriorate, and long term stable high speed heat treatment is enabled.

Even though molybdenum disilicide is used as the heat generating means, chemical reactivity is low with respect to the inorganic insulator material. Since heat shock is low, risk of open wiring in the heat generating means is absent.

DETAILED DESCRIPTION OF THE PREFERRED EMBODIMENTS

Following is a description, with reference to the figures, of this invention in terms of a preferred embodiment as a heating apparatus for a vertical heat-treatment apparatus.

Figure 1:
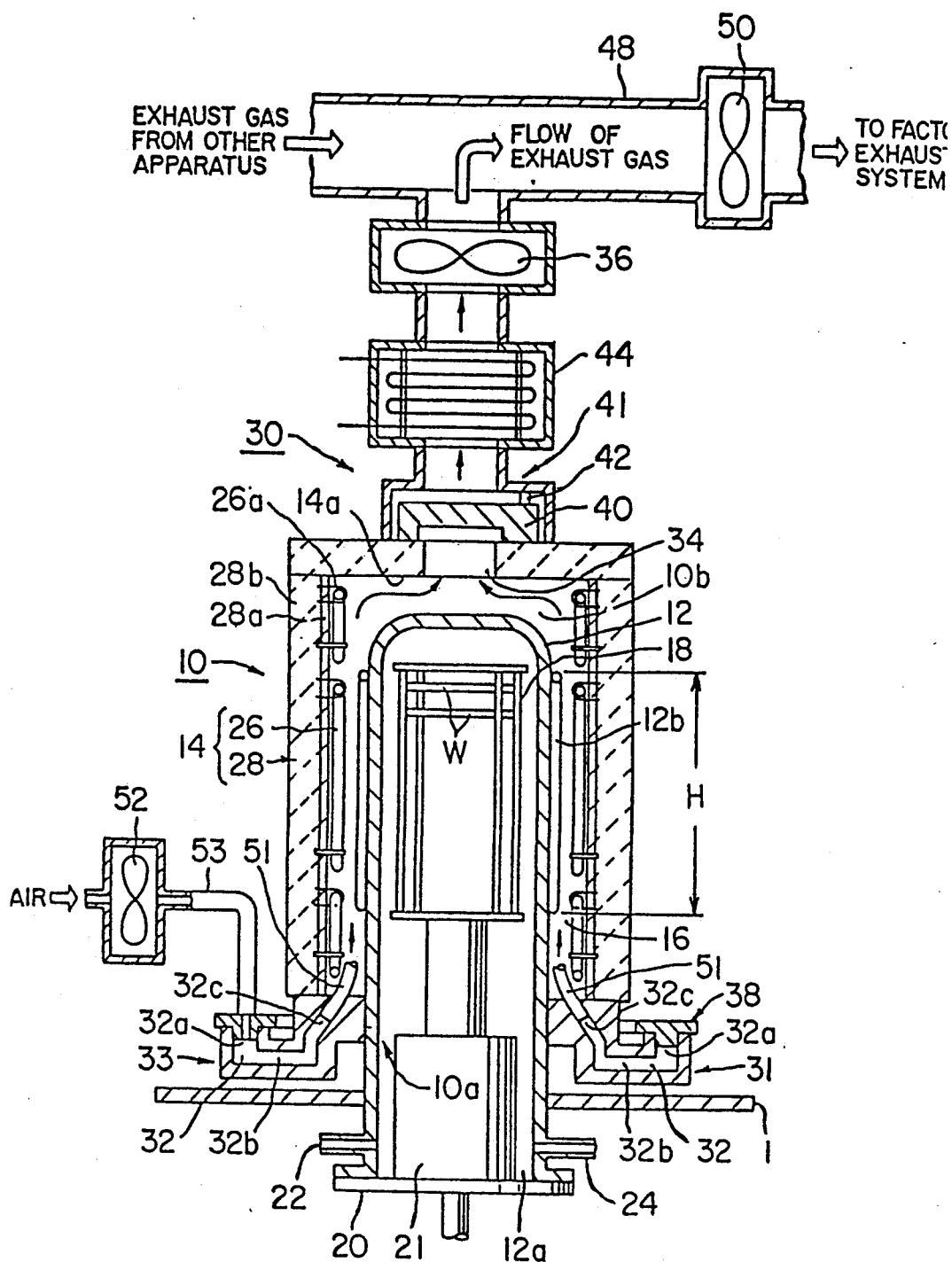
FIG. 1 is a vertical cross-sectional outline of an embodiment of this invention as a heating apparatus, FIG. 2 indicates a vertical cross-sectional view of a multilayer structure (heat insulator) and a heat generating means utilized in the heating apparatus of FIG. 1, FIG. 3 indicates an inclined view of one segment of the heat insulator having the multilayer structure with installed heat generating means.

As shown in FIG. 1, the heat treatment apparatus 10 of this example is provided with a process tube 12 and a heater section 14 mounted to the base 1. A specified space 16 is formed between this process tube 12 and the enclosing heater section 14.

The process tube 12 is formed of material such as quartz. From the bottom opening 12a, wafer boat 18, which is provided with temperature holding tube 21 at its bottom, is loaded into the process tube 12. Wafer boat 18 is composed so as to accommodate a plurality (for example, 25 to 100) of semiconductor wafers W in the wafer thickness direction.

Also, when wafer boat 18 is loaded in the process tube 12, a cover means 20 provided at the bottom of the temperature holding tube 21 tightly seals the bottom opening 12a. By this, a vacuum is produced in the process tube 12 through exhaust tube 24 provided at the bottom. As exhaust through exhaust tube 12 proceeds, a specified processing gas can be induced in the process tube 12 via gas conducting tube 22.

A uniform (flat) heating area H is formed in the process tube 12. Heater section 14 encasing process tube 12 comprises a heat generating means 26 which is sealed and encased by heat insulating means 28. As the heat generating means 26, for example, molybdenum disilicide ($MoSi_2$) can be used in a zigzag fashion to form a resistance type heat generating means (see FIG. 3). This heat generating means can also be formed in a coil shape.

This type of heat generating means is capable of rapid temperature rise such as 50–100 degrees C./minute. By this, the process tube 12 heating speed can be greatly improved.

Forced air cooling device 30 is provided at the top of heat treatment apparatus 10. This forced air cooling device 30 comprises cylindrical shaped suction duct 33 provided at the furnace opening end of heater section 14, a plurality of suction openings 32 and exhaust opening 34 provided at the top of heat treatment apparatus 10. Heat exchanger 44 is connected to this exhaust opening 34 and exhaust fan 36 is connected to this heat exchanger 44 as an exhaust means.

Suction openings 32 are provided at the bottom (opening end) of space 16, formed between process tube 12 and heater section 14 for the purpose of providing external air flow into process tube 12. These suction openings 32 comprise a plurality of suction openings 32a, which are coupled with external air and provided at equal spacing in the cylindrical direction, openings 32b at heater section 14 bottom and air conducting openings 32c in space 16. An equally spaced arrangement of suction openings 32 in this manner in the cylindrical direction at heater section 14 bottom opening (furnace opening) is desirable.

Exhaust opening 34 is provided for suction for directing the space 16 internal air flow to the apparatus exterior. This exhaust opening 34 is provided at the top 14a of heater section 14 in the center (furnace top 10b).

In other words, via a plurality of suction openings 32 the induced air flows from bottom to top in space 16 along the external circumference of process tube 12 and is concentrated in one location by exhaust opening 34 for natural exhaust to the apparatus exterior. For this reason, irregular gas flow at the external circumference of process tube 12 does not occur easily, and in turn, uniform cooling of the heat treatment apparatus is enabled.

In order to prevent temperature increase in the factory exhaust system, the air exhausted via exhaust opening 34 is cooled by heat exchanger 44, then exhausted by exhaust fan 50 via exhaust duct 48 to the factory exhaust system.

Exhaust fan 36, connected in the bottom flow of exhaust opening 34, is used for exhausting the air in space 16 of the heat treatment apparatus 10 to the apparatus exterior.

Nozzles 51 are inserted in air conducting openings 32c, and shutter means 32 is secured to duct 33. Suction opening 32 is connected to blower 52 via sending tube 53. Cooling of the heat treatment apparatus is promoted by forcibly inserting air in the furnace.

Figure 2:
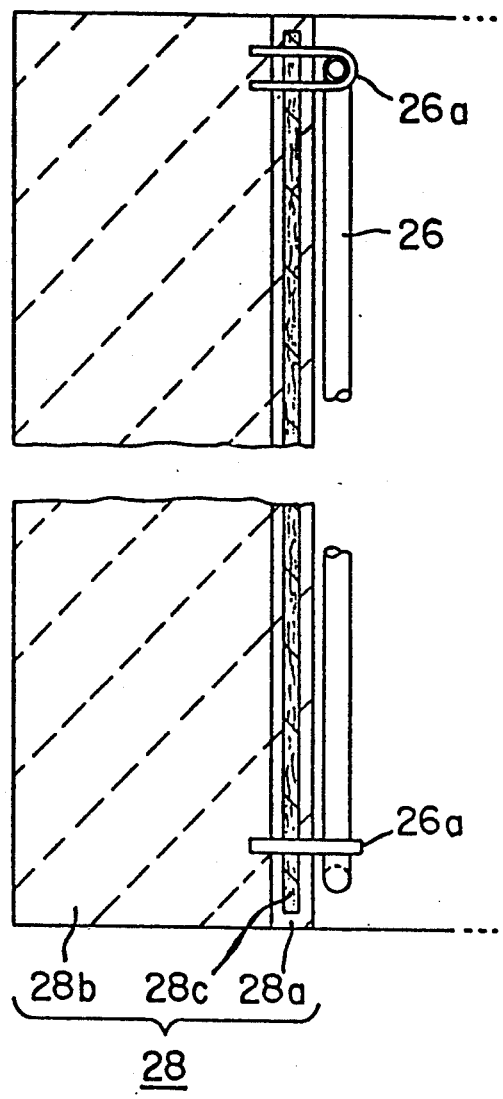

A feature of the heating device embodiment of this invention is that a multilayer structure comprises the heat insulator 28. In other words, as indicated in FIG. 2, an inorganic covering layer (internal tube) 28a of bulk density 1.0–2.0 g/cm³ covered on the inner face or all faces thereof by inorganic fiber cloth 28c is formed on the inner surface of the segmented inorganic molded structure (external tube) 28b of bulk density 0.3–0.8 g/cm³ (optimum density 0.5 g/cm³). The inner face of the inorganic insulator (inorganic covering layer) 28a supports the heat generating means 26.

Bulk density of the inorganic insulator 28a needs to be in the range of 1.0–2.0 g/cm³. If less than 1.0, endurance against wind and erosion are reduced. Conversely, if more than 2.0 g/cm³, endurance against spalling is reduced.

As this inorganic fiber cloth 28c for covering the inner face or all faces of the inorganic insulator 28a, alumina fiber cloth (bulk density 0.16–0.3 g/cm³) is very suitable. Also when covering inorganic insulator 28a material, this cloth 28c is applied at an inner face of inorganic molded structure 28b in a buried or embedded form on the inner face or covering all faces, for the purpose of suppressing cracks and particle generation in the inorganic molded structure 28b. This alumina cloth surface is in a form that resembles burlap cloth and has a thickness of less than 1 mm.

Inorganic insulator 28a can be made from alumina fabric, inorganic filler and inorganic binder, the respective ratio for example is 10–15, 40–60, 20–40 percent by weight.

As alumina fabric, ordinary $Al_2O_3$ component of more than about 70 percent by weight can be used. However, in order to provide low fabric deterioration due to recrystallization under high temperature, an $Al_2O_3$ component of more than 90 percent by weight is recommended, which possesses excellent thermal durability. Short fiber is also desirable for mixing in the inorganic filler and inorganic binder, since the good uniform dispersion promotes a reinforcement effect. As one example of a suitable short fiber, Rubyl of Nichiasu Co., Ltd., $Al_2O_3$ 95 percent, $SiO_2$; 5 percent by weight can be mentioned.

Examples of suitable inorganic filler include alumina powder and mullite powder. Among materials for the inorganic binder, colloidal silica or colloidal alumina can be used.

If molybdenum disilicide ($MoSi_2$) is used as the heat generating means, insulator materials composed from alumina fiber, alumina powder and colloidal alumina are desirable.

A high hardness rating for the inorganic insulator 28a is recommended in order to increase durability against spalling. For example, Vickers hardness of about Hv 50–100 is desirable.

Surface roughness of the inorganic insulator 28a should be less than 20 μm in order to prevent scattering of material particles produced by rapid heating and cooling.

Inorganic insulator 28a thickness in the range of about 0.5–0.3 mm is desirable so as to prevent crack generation due to thermal shock and improve temperature rise response under the low heat capacity.

Figure 4:
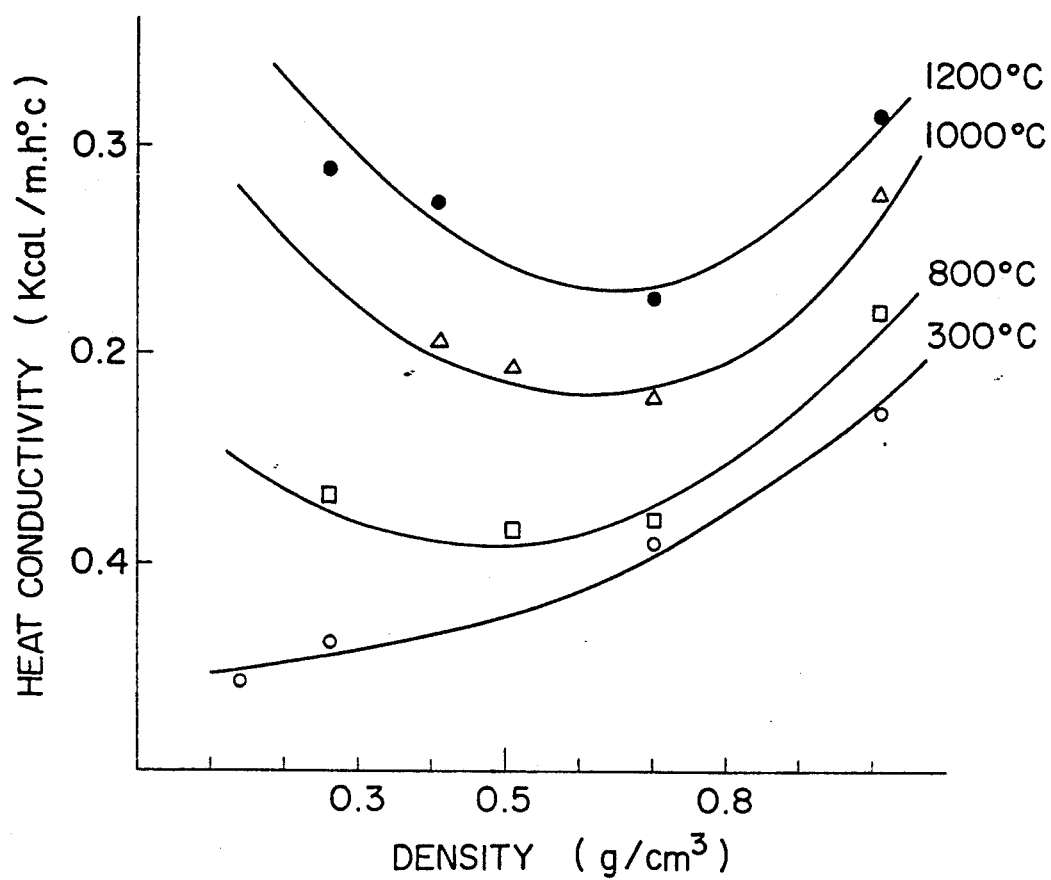
FIG. 4 is a graph indicating the relationship between heat conductivity and bulk density.

The inorganic molded structure 28b bulk density needs to be in the range of 0.3–0.8 $g/cm^3$. As shown in FIG. 4, if the bulk density is less than 0.3, heat conductivity increases under high temperature (over 1000 degrees C.), while heat insulating response declines. Conversely, if the bulk density exceeds 0.8, heat capacity increases and the weight is increased.

The inorganic molded structure 28b can be formed from inorganic fiber, inorganic filler and inorganic binder. Their respective ratios can be, for example, 20–65, 35–70, and 3–10 percent by weight.

The actual materials for the inorganic fiber, inorganic filler and inorganic binder can be the same as those for the inorganic insulator 28a.

Thickness of the inorganic molded structure 28b is about 5–30 mm.

High temperature baking is desired for the heat insulator 28 comprising inorganic insulator 28a and inorganic molded structure 28b. High temperature is defined here is a temperature higher than that actually reached by the heat insulator 28 when the heating device is used.

For example, when the heating apparatus is used for semiconductor wafer oxidation or scattering treatment, since the treatment temperature reaches about 1200 degrees C., an example of the baking temperature is 1200–1600 degrees C.

By baking at this type of high temperature, cracking and peeling due to heat shock are suppressed in the delicate inorganic insulator 28a, while spalling endurance is improved.

Also, from the aspect of crystal structure, free $SiO_2$ component is reduced in the composition of the inorganic insulator 28a, by mullite $(3Al_2O_3 \cdot 2SiO_2)$ conversion of $Al_2O_3$ and $SiO_2$, improving thermal durability and suppressing chemical reaction with the heating means 2, comprised of molybdenum disilicide ($MoSi_2$), and preventing deterioration of the heating means 2.

The desirable total mixed amount of alkaline metals sodium (Na) and potassium (K) in heat insulator 28 is less than 2000 ppm, while preferred heavy metal amounts are: copper (Cu) less than 50 ppm, iron (Fe) less than 500 ppm, and nickel (Ni) less than 50 ppm. By suppressing the amount of these type metal element impurities, spalling endurance of the heat insulator 28 can be further improved, along with anti-contamination properties.

Figure 3:
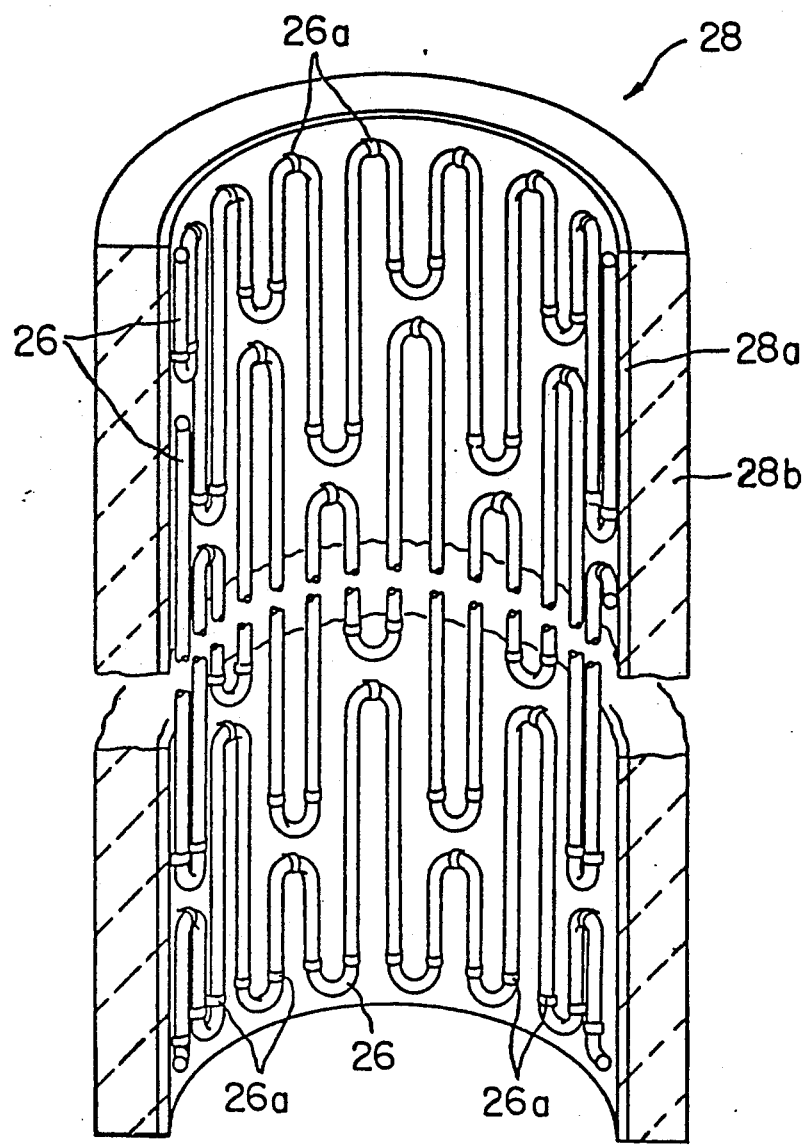

Although the assembled structure of heat insulator 28 is a cylinder shape, as shown in FIG. 3, it is formed from, for example, two partially cylindrical segments.

Heat generating means 26 is a single wire element vertically bent in a U shape and vertically formed in a continuous zigzag fashion. By staples 26a, this heat generating means 26 is attached to and supported by the heat insulator 28 inner wall, which is inorganic insulator 28a. This attachment method, by which the upper end of heat generating means 26 is suspended in a key shape by staples 26a, and the bottom end bent in a U shape and attached by staples 26a permits that free thermal expansion and contraction.

The actual manufacturing can be in the following manner.

(1) A tube structure (inner structure) is formed using alumina cloth, inorganic filler and inorganic binder for covering the inorganic insulator. This is vertically divided into 4, alumina cloth is bonded to the front face of each divided structure so that the inner face or all faces are covered, then these are baked.

(2) The inorganic molded tube structure (outer tube structure 28b) is formed using inorganic cloth, inorganic filler and inorganic binder. This is divided into two vertical segments one of which is shown in FIG. 3.

(3) On of the divided outer tube structures, two divided structures (inner structures 28a) are arranged. Both are bonded and dried to produce one insulator.

(4) The heat generating means is secured with staples to the inner face of the one insulator obtained by the above (3) process to produce one half of the divided structure.

(5) Obtain the other half of the divided structure by the same process as above (3) and (4).

(6) Join the two divided structure halves to form a cylinder and obtain the heat insulator 28.

Molybdenum disilicide ($MoSi_2$) can be used as the heat generating means 26. This $MoSi_2$ can be used as a single wire. Since it can adequately endure high temperature of about 1800 degrees C., it is a suitable heat generating material for a heating apparatus for processing at high temperature. Also, as the heat capacity of $MoSi_2$ is low, it is appropriate for temperature increase at high speed.

Forced air cooling device 30 is provided since in the oxidation of scattering treatment of semiconductor wafers, it is desirable to cool the uniformed heating area H of the process tube 12 to about 300–400 degrees C.

The foregoing has been a description of this invention based on a preferred embodiment. However, the heating apparatus of this invention can also be applied to normal pressure processing, reduced pressure processing and vacuum processing. It is also applicable to such processes as oxidation treatment, scattering treatment, CVD treatment and annealing.

As described above, the following results can be obtained from the heating apparatus of this invention.

(1) A heating apparatus can be obtained with superb endurance against spalling, deterioration and chemical reaction.

(2) A low distortion heating apparatus can be obtained.

(3) Even with complex construction, a precision heating apparatus can be obtained.

(4) A clean heating apparatus can be obtained.

(5) A clean and strong heating apparatus can be obtained.

(6) A heating apparatus can be obtained with superb endurance against contamination.

(7) A heating apparatus can be obtained that is capable of long term stable operation under high speed temperature increase and decrease.

What is claimed is:

1. A heating apparatus having a processing vessel with an internal area wherein a target object is placed and a multilayer insulating structure arranged so as to enclose said processing vessel, said multilayer insulating structure comprising:

an inorganic molded structure of bulk density of 0.3–0.8 g/cm$^3$;

an inorganic covering layer of bulk density of 1.0–2.0 g/cm$^3$ covered on an inner face or all faces thereof by inorganic fiber cloth which is buried therein, said inorganic covering layer being formed on the inner surface of said inorganic molded structure; and a support means for supporting a heat generating means provided on the inner face of said inorganic covering layer.

2. The heating apparatus according to claim 1, wherein said multilayer insulating structure is cured by baking.

3. The heating apparatus according to claim 1, wherein said inorganic molded structure is formed in a cylindrical shape by combining a plurality of segments.

4. The heating apparatus according to claim 1, wherein said inorganic molded structure is formed from alumina fiber, inorganic filler and inorganic binder.

5. The heating apparatus according to claim 4, wherein said alumina cloth is composed of more than 90 weight percent of $Al_2O_3$.

6. The heating apparatus according to claim 1, wherein metal element impurities included in said multilayer structure are to the following ranges:

| Total sodium (Na) and potassium (K) | less than 2000 ppm |
|---|---|
| Copper (Cu) | less than 50 ppm |
| Iron (Fe) | less than 500 ppm |
| Nickel (Ni) | less than 50 ppm |

7. The heating apparatus according to claim 1, wherein a cooling means is provided for the flat heating area of said processing vessel.

8. The heating apparatus according to claim 1, wherein said heat generating means comprises molybdenum disilicide ($MoSi_2$).

9. The heating apparatus according to claim 1, wherein a forced air cooling means is provided.

10. The heating apparatus according to claim 1, wherein said target objects are semiconductor wafers.

11. The heating apparatus according to claim 1, wherein said heat generating means is supported by staples at the inner face of said multilayer insulating structure.

12. The heating apparatus according to claim 1, wherein said inorganic molded structure comprises an inner portion of said multilayer insulating structure.

13. The heating apparatus according to claim 1, wherein said inorganic covering layer is formed in a cylindrical shape by combining a plurality of segments.

* * * * *